United States Patent
Lee et al.

(10) Patent No.: US 8,455,363 B2
(45) Date of Patent: Jun. 4, 2013

(54) METHOD FOR ADJUSTING TRENCH DEPTH OF SUBSTRATE

(75) Inventors: Tzung-Han Lee, Taipei (TW);
Chung-Lin Huang, Taoyuan County (TW)

(73) Assignee: Inotera Memories, Inc., Taoyuan County (TW)

(*) Notice: Subject to any disclaimer, the term of this patent is extended or adjusted under 35 U.S.C. 154(b) by 0 days.

(21) Appl. No.: 13/282,593

(22) Filed: Oct. 27, 2011

(65) Prior Publication Data
US 2013/0059442 A1    Mar. 7, 2013

(30) Foreign Application Priority Data
Sep. 7, 2011   (TW) .............................. 100132224 A

(51) Int. Cl.
*H01L 21/311* (2006.01)
(52) U.S. Cl.
USPC .................................. 438/702; 257/E21.214
(58) Field of Classification Search
USPC .................................. 438/702; 257/E21.214
See application file for complete search history.

(56) References Cited

U.S. PATENT DOCUMENTS

| 6,251,791 B1 * | 6/2001 | Tsai et al. ...................... 438/700 |
| 7,572,713 B2 * | 8/2009 | Ito et al. ......................... 438/424 |
| 2009/0258499 A1 * | 10/2009 | Huang et al. ................... 438/703 |

* cited by examiner

*Primary Examiner* — Tony Tran
(74) *Attorney, Agent, or Firm* — Rosenberg, Klein & Lee

(57) ABSTRACT

A method for adjusting the trench depth of a substrate has the steps as follows. Forming a patterned covering layer on the substrate, wherein the patterned covering layer defines a wider spacing and a narrower spacing. Forming a wider buffering layer arranged in the wider spacing and a narrower buffering layer arranged in the narrower spacing. The thickness of the narrower buffering layer is thinner than the wider buffering layer. Implementing dry etching process to make the substrate corresponding to the wider and the narrower buffering layers form a plurality of trenches. When etching the wider and the narrower buffering layers, the narrower buffering layer is removed firstly, so that the substrate corresponding to the narrower buffering layer will be etched early than the substrate corresponding to the wider buffering layer.

2 Claims, 5 Drawing Sheets

METHOD FOR ADJUSTING TRENCH DEPTH OF SUBSTRATE

BACKGROUND OF THE INVENTION

1. Field of the Invention

The instant disclosure relates to a manufacturing method of semiconductor; and more particularly, to a method for adjusting the trench depth on a semiconductor substrate.

2. Description of Related Art

Semiconductor components are becoming smaller and smaller, so that the spacing of the trenches on the substrate is also required to be dramatically reduced in size. When a substrate is etched to form miniature trenches, the reactant or the ion cannot effectively reach the bottom of the substrate, or the product cannot be exhausted easily, so that the etching rate is reduced. The above phenomenon is called the micro loading effect.

As FIGS. 1 and 2 shown, a conventional covering layer 2a is disposed on a substrate 1a. The covering layer 2a defines a narrower spacing d1 and a wider spacing d2. When the substrate 1a is etched, the portion of the substrate 1a corresponding to the narrower spacing d1 is etched to form a shallow trench t1, the portion of the substrate 1a corresponding to the wider spacing d2 is etched to form a deep trench t2. The depth of the shallower trench t1 and the depth of the deeper trench t2 differ by a value h. When the substrate 1a is etched, the portion of the substrate 1a corresponding to the narrower spacing d1 is more likely to suffer the micro loading effect, so that the depth of the trench t1 may be smaller than the depth of the trench t2.

SUMMARY OF THE INVENTION

One object of the instant disclosure is to provide a method for adjusting the trench depth of a substrate, whereby the influence generated form the micro loading effect can be improved.

A method for adjusting the trench depth of a semiconductor substrate includes the steps in accordance with the instant disclosure as follows. Forming a patterned covering layer on the substrate, wherein the patterned covering layer has a plurality of shelters, the shelters define an alternatively arranged wider spacing and narrower spacing. Forming a buffering layer on the substrate between the alternatively spaced shelters, wherein the buffering layer arranged in the wider spacing is named a wider buffering layer, the buffering layer arranged in the narrower spacing is named a narrower buffering layer, wherein the thickness of the narrower buffering layer is thinner than the thickness of the wider buffering layer. Implementing a dry etching process to form a plurality of wider trenches and a plurality of narrower trenches on the substrate corresponding to the wider and the narrower buffering layers respectively, wherein when etching the wider and the narrower buffering layers, the narrower buffering layer is removed prior to the wider buffering layer, so that the portion of the substrate corresponding to the narrower buffering layer is etched earlier than the portion of the substrate corresponding to the wider buffering layer.

Preferably, the buffering layer is silica layer. When implementing the dry etching process to the wider and narrower buffering layers, the gas used for the dry etching process is halogen hydride gas.

Preferably, when the narrower buffering layer is removed, the selective ratio of the dry etching process is adjusted to increase the etching ratio of the portion of the substrate corresponding to the narrower buffering layer and to decrease the etching ratio of the wider buffering layer.

Preferably, the buffering layer is silica layer. When the narrower buffering layer is removed, the gas used for the dry etching process is replaced by fluorocarbon gas to adjust the selective ratio of the dry etching process.

Preferably, when the portion of the substrate corresponding to the narrower buffering layer is etched to a predetermined depth, the wider buffering layer is removed at the same time, and then the portion of the substrate corresponding to the wider buffering layer starts to be etched.

Preferably, the predetermined depth is approximately equal to a differential value, wherein the differential value is evaluated form the substrate etched via a micro loading effect.

Preferably, when the depth of the wider trench approximately equals to the depth of the narrower trench, the dry etching process is stopped.

Preferably, before forming the patterned covering layer, covering layer is formed on the substrate and a patterned photoresistor layer is formed on the covering layer, and then etching the covering layer to form patterned covering layer by the patterned photoresistor layer.

Preferably, the covering layer includes a hard mask layer disposed on the substrate, an oxide layer disposed on the hard mask layer, and a carbonic layer disposed on the oxide layer.

Preferably, the material of the hard mask layer is at least one of silicon nitride and oxynitride (SiON).

The instant disclosure can be used for adjusting the trench depth of the substrate, because the thickness of the narrower buffering layer is thinner than the thickness of the wider buffering layer, and the etching time of the portion of the substrate corresponding to the narrower buffering layer is longer than the etching time of the portion of the substrate corresponding to the wider buffering layer.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

Figure 1:
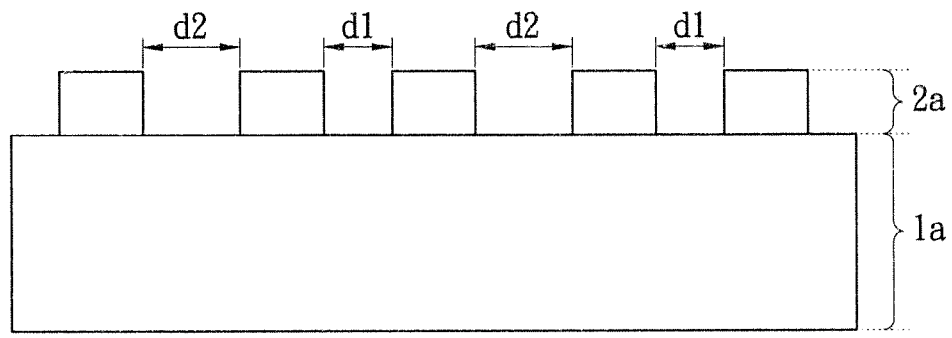
FIG. 1 is a schematic view illustrating the covering layer of the substrate of the related art.
Figure 2:
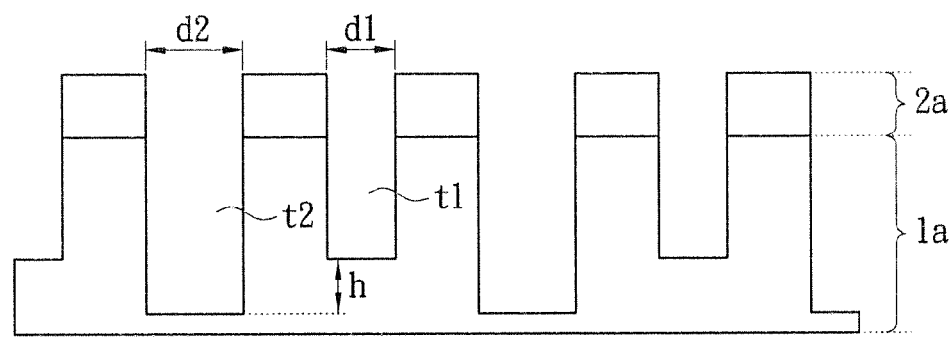
FIG. 2 is a schematic view illustrating the covering layer of the substrate etched via the micro loading effect of the related art.
Figure 3:
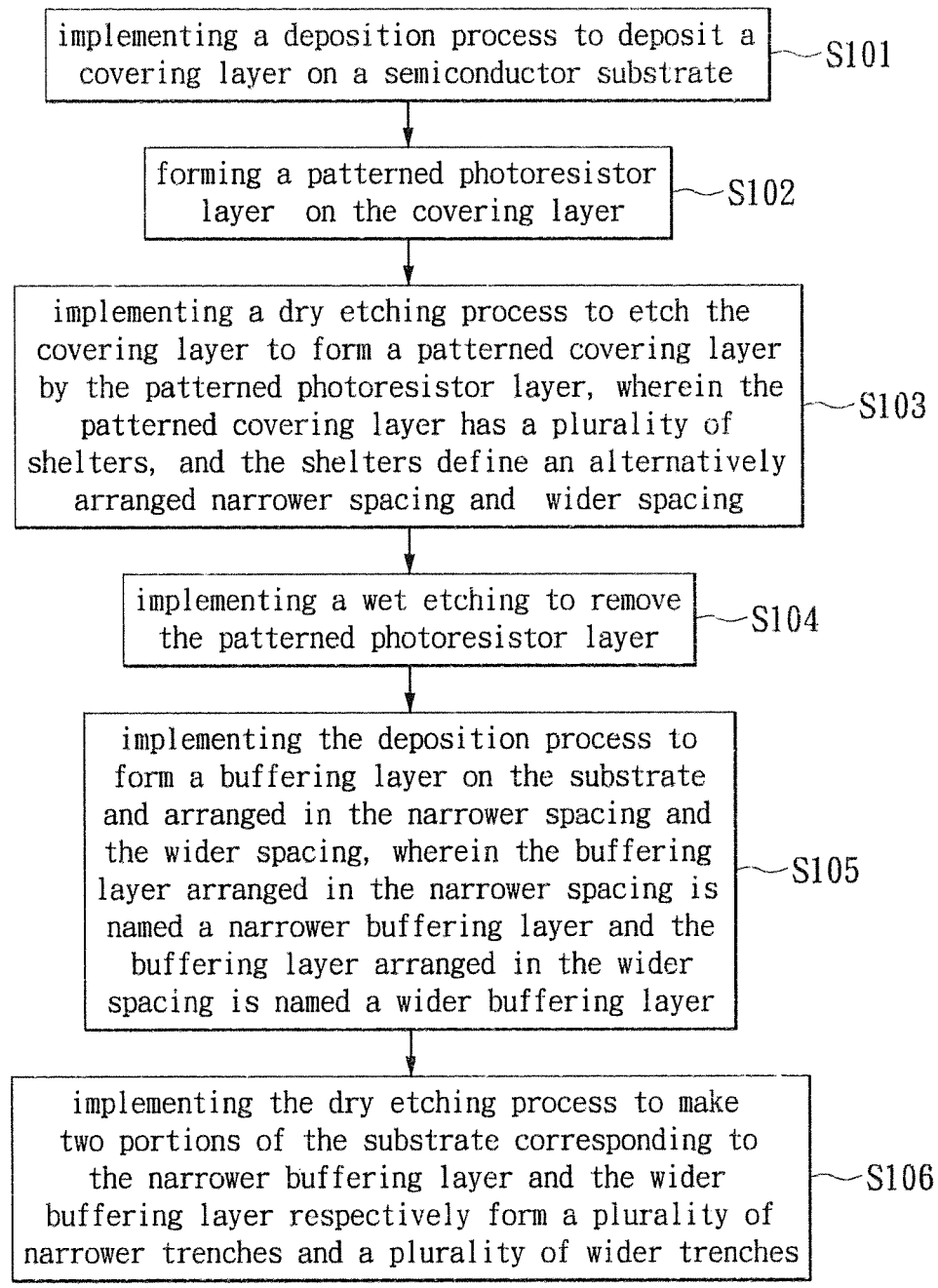
FIG. 3 is a flow chart illustrating the steps of the instant disclosure.

Please refer to FIGS. 3-8, which show a preferable embodiment of the instant disclosure. FIG. 3 shows a flow chart, while FIGS. 4 to 8 are side schematic illustrations.

The instant disclosure relates to a method for adjusting trench depth of a semiconductor substrate. The method includes the steps listed as follows.

Figure 4:
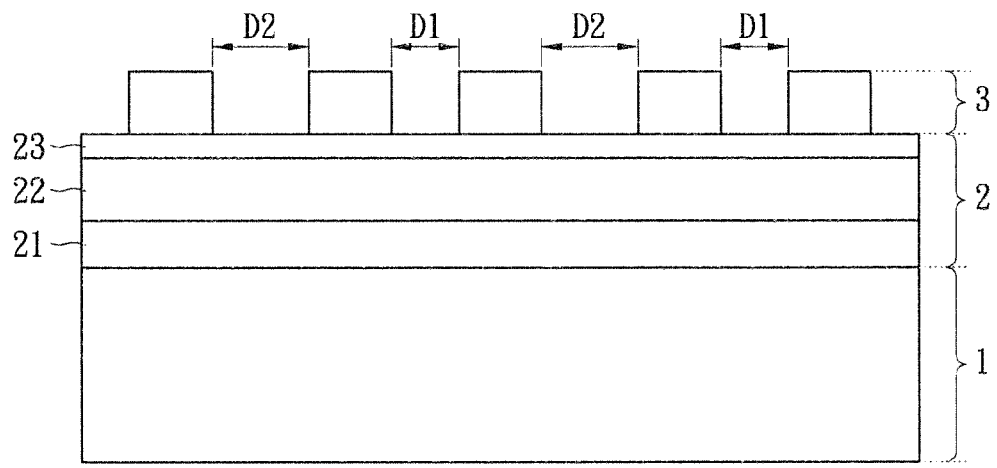
FIG. 4 is a schematic view illustrating the steps S101 and S102 of the instant disclosure.

Please refer to FIG. 4, which corresponds to steps S101 and S102 of the flow chart (FIG. 3). Step S101 implements a deposition process to deposit a covering layer 2 on a substrate 1. The covering layer 2 includes a hard mask layer 21 disposed on the substrate 1, an oxide layer 22 disposed on the hard mask layer 21, and a carbonic layer 23 disposed on the oxide layer 22. However, in practice, the composition and the order of the covering layer 2 is not limited to the exemplary arrangement provided above.

The material of the substrate 1 can be at least one of epitaxy, silicon, gallium arsenic, gallium nitride, strain silicon, silicon germanium, carborundum, diamond, and the other suitable material. The material of the hard mask layer 21 can be at least one of silicon nitride, oxynitride (SiON), and the other suitable material.

The deposition process can be physical vapor deposition (PVD), chemical vapor deposition (CVD), or the other suitable deposition process.

Step S102 forms a patterned photo-resistor layer 3 on the covering layer 2. The patterned photoresistor layer 3 defines a narrower spacing D1 and a wider spacing D2. Because the formation of photo-resist layers is well known within the skill of the art, the instant embodiment does not descript the detail steps of forming the patterned photo-resistor layer.

Figure 5:
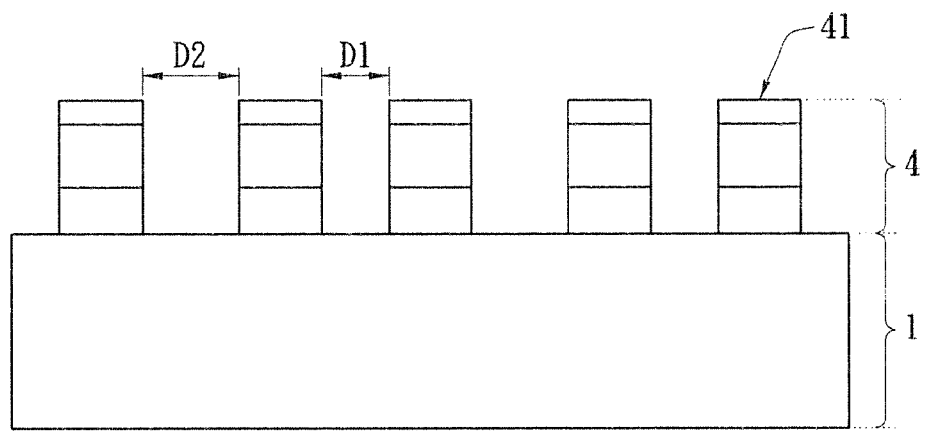
FIG. 5 is a schematic view illustrating the steps S103 and S104 of the instant disclosure.

Please refer to FIG. 5, which corresponds to steps S103 and S104. Step S103 implements a dry etching process through the use of the patterned photo-resist layer 3 to etch the covering layer 2 in forming a patterned covering layer 4. The resulting patterned covering layer 4 has a plurality of shelters 41. Moreover, the alternating arrangement of narrower spacing(s) D1 and wider spacing(s) D2 is substantially retained.

The dry etching process includes a physical etching (such as sputter etching or ion beam etching); a chemical etching (such as plasma etching); and a physical-chemical etching (such as reactive ion etching). However, the actual selection of the abovementioned etching techniques in the dry etching step may depend on specific practical requirements.

Step S104 implements a wet etching process to remove the patterned photoresistor layer 3.

Figure 6:
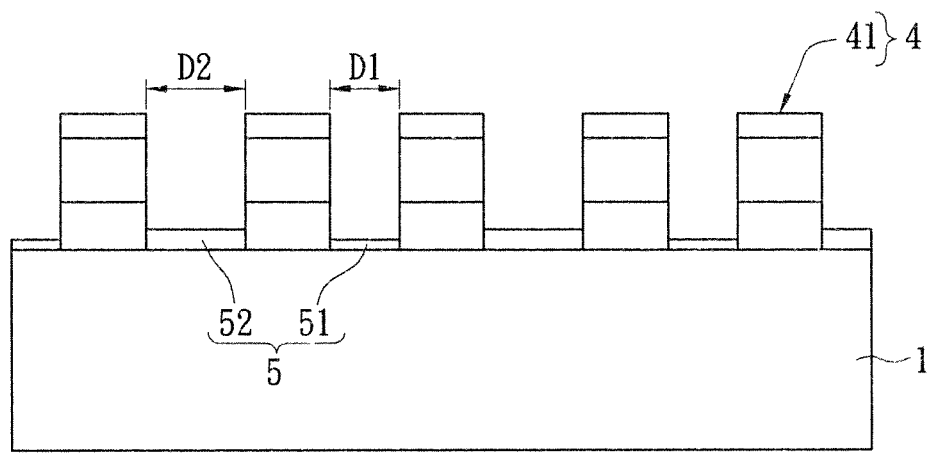
FIG. 6 is a schematic view illustrating the step S105 of the instant disclosure.

Please refer to FIG. 6, which shows the step S105. The step S105 is implementing the deposition process to form a buffering layer 5 on the substrate 1 and arranged in the narrower spacing D1 and the wider spacing D2. The buffering layer 5 can be oxide layer, for example the buffering layer 5 can be silica layer. However, in use, the buffering layer 5 is not limited thereto.

Moreover, the buffering layer 5 can be classified according to width thereof. The buffering layer 5 arranged in the narrower spacing D1 is named a narrower buffering layer 51. The buffering layer 5 arranged in the wider spacing D2 is named a wider buffering layer 52. The thickness of the narrower buffering layer 51 is thinner than the thickness of the wider buffering layer 52.

Additionally, the thickness of the narrower buffering layer 51 and the thickness of the wider buffering layer 52 can be adjusted in accordance with the practical condition. Generally, when the width of the narrower spacing D1 and the width of the wider spacing D2 become smaller, the thickness of the narrower buffering layer 51 and the thickness of the wider buffering layer 52 will be adjusted thinner.

Figure 7:
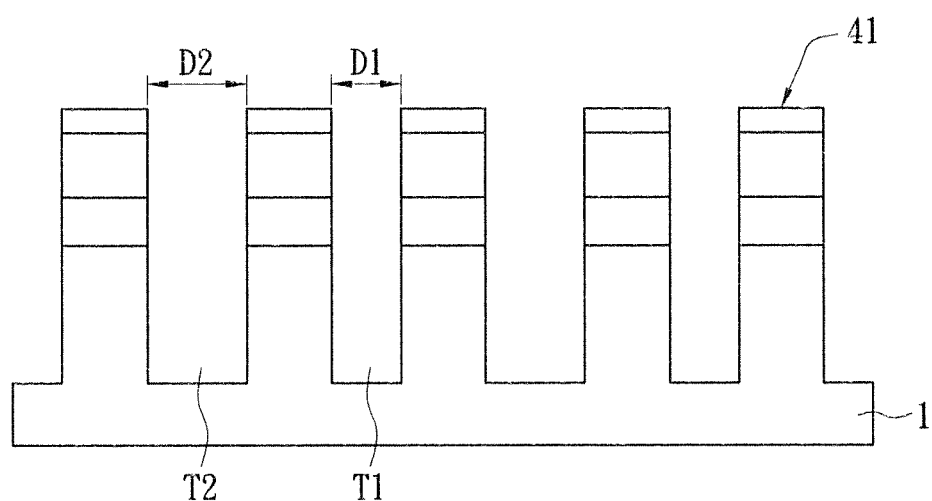
FIG. 7 is a schematic view illustrating the step S106 of the instant disclosure.

Please refer to FIG. 7, which shows the step S106. The step S106 is implementing the dry etching process to make two portions of the substrate 1 corresponding to the narrower buffering layer 51 and the wider buffering layer 52 respectively form a plurality of narrower trenches T1 and a plurality of wider trenches T2.

Figure 7A:
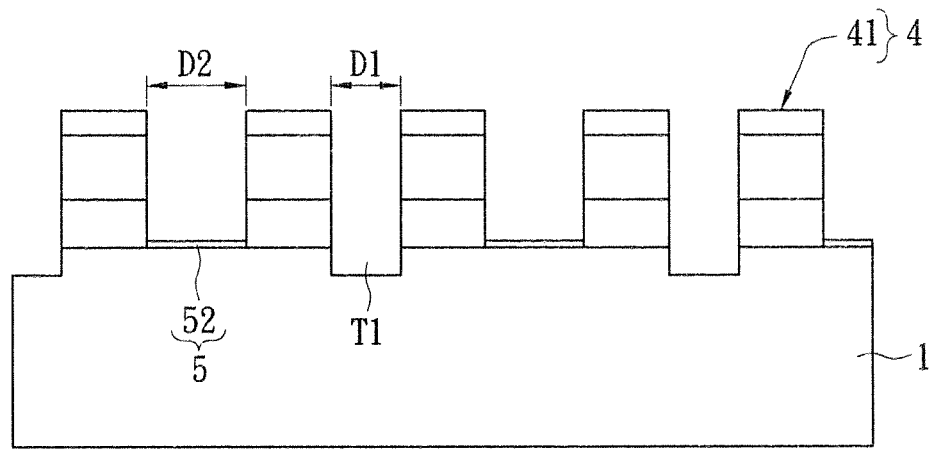
FIG. 7A is a schematic view illustrating the narrower buffering layer removed during the step S106 of the instant disclosure.

Moreover, as FIG. 7A shown, when etching the narrower buffering layer 51 and the wider buffering layer 52, the narrower buffering layer 51 is removed firstly, because the thickness of the narrower buffering layer 51 is thinner than the thickness of the wider buffering layer 52. Thus, the portion of the substrate 1 corresponding to the narrower buffering layer 51 is etched early than the portion of the substrate 1 corresponding to the wider buffering layer 52. At this time, the selective ratio of the dry etching process can be adjusted to increase the etching ratio of the portion of the substrate 1 corresponding to the narrower buffering layer 51 and to decrease the etching ratio of the wider buffering layer 52.

More specifically, when implementing the dry etching process to the narrower buffering layer 51 and the wider buffering layer 52, the gas used for the dry etching process is halogen hydride gas (such as $HCl_3$, $HCl_2$, or HBr). When the narrower buffering layer 51 is removed, the gas used for the dry etching process is replaced by fluorocarbon gas (such as $CF_4$, $CHF_3$, or $C_4F_6$) to adjust the selective ratio of the dry etching process.

Figure 7B:
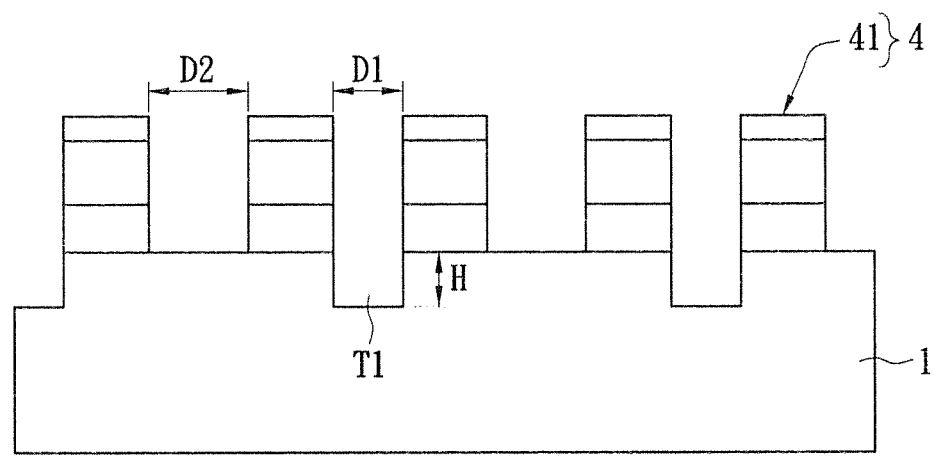
FIG. 7B is a schematic view illustrating the wider buffering layer removed during the step S106 of the instant disclosure.

In addition, as FIGS. 7A and 7B shown, the portion of the substrate 1 corresponding to the narrower buffering layer 51 can be etched to a predetermined depth H, because the thickness of the narrower buffering layer 51 different from the thickness of the wider buffering layer 52. At the same time, the wider buffering layer 52 is removed, and the portion of the substrate 1 corresponding to the wider buffering layer 52 starts to be etched. And then, when the depth of the wider trench T2 approximately equals to the depth of the narrower trench T1, the dry etching process is stopped.

The predetermined depth H is approximately equal to a differential value, which is regarded as the differential value h of the related art.

Thus, the depth of the narrower trench T1 and the depth of the wider trench T2 of the substrate 1 can be adjusted by carrying out the steps S101 to S106 in order to improve the influence generated form the micro loading effect, whereby the depth of the narrower trench T1 and the depth of the wider trench T2 of the substrate 1 are approximately the same.

The description above only illustrates specific embodiments and examples of the instant disclosure. The instant disclosure should therefore cover various modifications and variations made to the herein-described structure and operations of the instant disclosure, provided they fall within the scope of the instant disclosure as defined in the following appended claims.

What is claimed is:

1. A method for adjusting the trench depth of a semiconductor substrate, comprising the steps of:

forming a patterned covering layer on a substrate to define an alternatively arranged wider spacing and narrower spacing, the patterned covering layer being formed by forming a covering layer on the substrate and then a patterned photoresist layer thereon, exposed portions of the covering layer being etched to form the patterned covering layer, the covering layer including a hard mask layer disposed on the substrate, an oxide layer disposed on the hard mask layer, and a carbonic layer disposed on the oxide layer;

forming a wider buffering layer in the wider spacing and a narrower buffering layer in the narrower spacing, wherein the thickness of the narrower buffering layer is thinner than the wider buffering layer;

executing a dry etching process to etch the wider and the narrower buffering layers to respectively form a wider trench and a narrower trench by firstly using halogen hydride gas, upon the narrower buffering layer is removed, replacing the halogen hydride gas by fluorocarbon gas for adjusting selective ratio, so that the portion of the substrate corresponding to the narrower buffering layer is etched earlier than the portion of the substrate corresponding to the wider buffering layer, wherein the portion of the substrate corresponding to the narrower is etched to a predetermined depth when the wider buffering layer is removed; and terminating the dry etching process when the depth of the wider trench approximately equals to the depth of the narrower trench.

2. The method as claimed in claim 1, wherein the material of the hard mask layer is at least one of silicon nitride and oxynitride (SiON).

\* \* \* \* \*